United States Patent [19]

Lane et al.

[11] 4,258,423

[45] Mar. 24, 1981

[54] MICROPROCESSOR CONTROLLED DIGITAL DETECTOR

[75] Inventors: Richard A. Lane, Huntsville, Ala.; Donald K. Fronek, Sparks, Nev.

[73] Assignee: The United States of America as represented by the Secretary of the Army, Washington, D.C.

[21] Appl. No.: 100,685

[22] Filed: Dec. 5, 1979

[51] Int. Cl.³ .................... H03K 9/06; G06F 15/20
[52] U.S. Cl. .................... 364/484; 324/78 D; 328/138; 328/140
[58] Field of Search .................... 364/481, 484; 307/233 R; 324/78 R, 78 D, 78 E, 78 F; 328/138, 140

[56] References Cited

U.S. PATENT DOCUMENTS

| | | | |
|---|---|---|---|
| 3,909,599 | 9/1975 | Trott, Jr. et al. | 364/484 |
| 3,990,007 | 11/1976 | Hohhof | 324/78 D X |
| 4,004,236 | 1/1977 | Cardon et al. | 328/138 |
| 4,047,114 | 9/1977 | Lane et al. | 328/140 |
| 4,107,600 | 8/1978 | McMannis | 324/78 R |
| 4,150,432 | 4/1979 | Sorden | 364/484 |

*Primary Examiner*—Jerry Smith
*Attorney, Agent, or Firm*—Nathan Edelberg; Robert P. Gibson; Freddie M. Bush

[57] ABSTRACT

In the digital detector the center frequency and bandwidth of a digital filter is controlled by a microprocessor. Amplitude information for the original input signal may be preserved or a simple threshold of energy may be detected within a bandpass. The microprocessor scans a selected frequency spectrum by digitally changing the decoding data controlled by software. This detector in conjunction with a scanning algorithm permits data acquisition in addition to energy detection, data acquisition being the process of controlling an incoming signal within a bandpass by moving the center frequency and bandpass of the filter and generating a corresponding error signal as the feedback control signal.

6 Claims, 3 Drawing Figures

MICROPROCESSOR CONTROLLED DIGITAL DETECTOR

DEDICTORY CLAUSE

The invention described herein may be manufactured, used, and licensed by or for the Government for governmental purposes without the payment to us of any royalties thereon.

BACKGROUND OF THE INVENTION

Digital filtering and detection techniques have enhanced signal processing with the aid of faster hardware and efficient softwave to provide a logic signal indicative of a desired energy within the passband and to preserve the signal amplitude. A particular digital detector is also disclosed by R. A. Lane and D. K. Fronek in U.S. Pat. No. 4,047,114 issued Sept. 6, 1977. The detector is responsive to a broad spectrum of input frequencies to detect the presence of a selectable frequency with specified bandwidth. The bandwidth logic and center frequency logic of the decoder may be adjusted across a broad frequency range. Incoming continuous signals are received by a wave shaping circuit (Schmitt trigger), to change a slow moving waveform such as a sine wave or triangular wave to a square wave whose period is processed digitally by a gate circuit and multivibrator circuit.

As the input crosses a threshold, the wave shaping circuit produces an ON level of signal that represents the period of the incoming signal. A gated oscillator (pulse generator), which is running many times faster than the input signal, provides the counting signal that is processed by an up-counter. The gate circuit provides a stable window of gate pulses representing the period of the input waveform. The gated pulses are counted by the up-counter. This counter may be any length or any radix, such as binary or binary coded decimal. The output of the counter is fed to a decoder for final processing.

The multivibrator circuit performs administrative timing control. When the output of the wave shaping circuit falls, a monostable is triggered, this monostable provides a timed pulse to a latch to store the count. At the end of the pulse produced by the first monostable, it's falling edge causes a second monostable to generate a pulse to clear the up-counter for new data. The latch temporarily stores the counter data for processing by the combinational decoder module. The output from this module indicates the desired center frequency energy in the filter. Additional outputs, $f_L$ and $f_H$, are optionally provided to permit a bandwidth tolerance.

SUMMARY OF THE INVENTION

A microprocessor controlled digital detector has a center frequency and bandpass which can be changed as a function of time. Amplitude signal information can be preserved. Input signals are shaped for digital processing. A peripheral interface adapter formats these inputs for the microprocessor which is under both ROM and RAM program control for determining the center frequency. The microprocessor output is through a peripheral interface adapter.

DESCRIPTION OF THE PREFERRED EMBODIMENT

Figure 1:
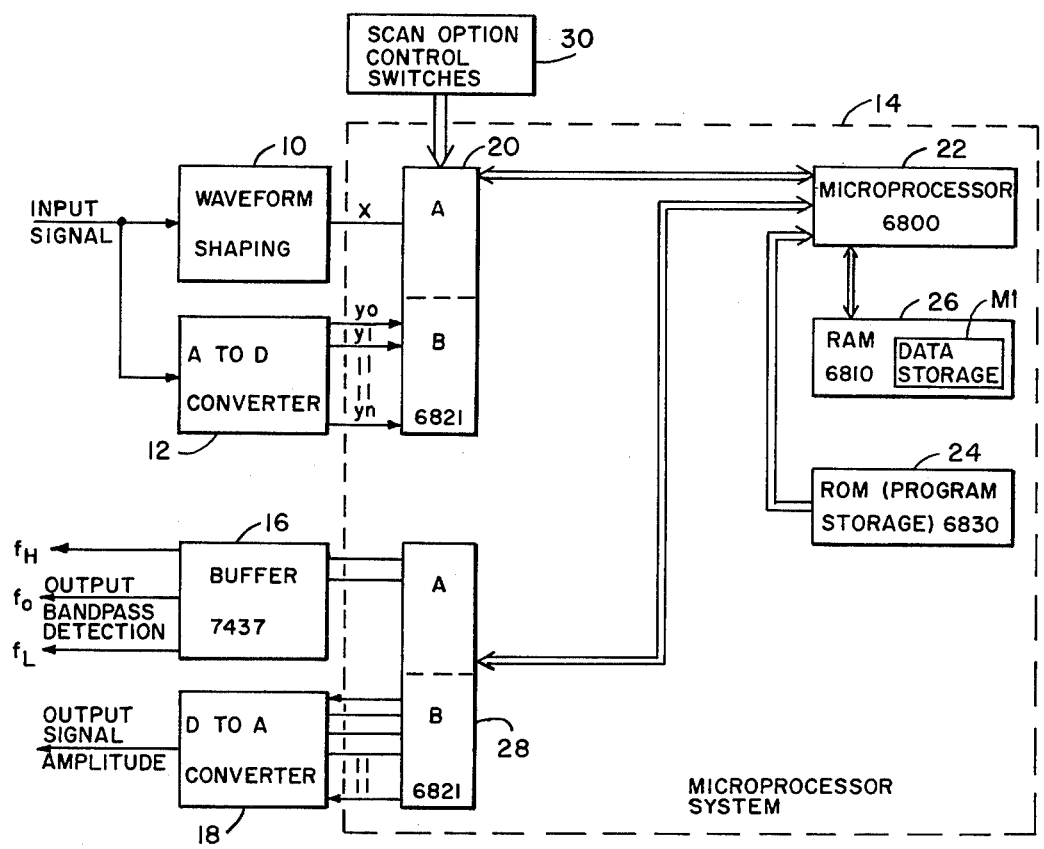
FIG. 1 is a block diagram of a preferred embodiment of the microprocessor digital detector.

Referring now to the drawings, FIG. 1 is a preferred embodiment of the detector. In the microprocessor controlled digital detector, input signals are supplied to waveform shaping circuit 10 such as a Schmitt trigger and to an analog-to-digital converter 12. Outputs from shaping circuit 10 and converter 12 are coupled as inputs to a microprocessor system 14. Outputs from the microprocessor system 14 are coupled to a buffer 16 and to a digital-to-analog converter 18. Converter 18 provides the output signal amplitude, and buffer 16 provides a signal indicating the output bandpass detection and center frequency, with $f_o$ = center frequency of the input signal, $f_H$ = the upper bandpass limit, and $f_L$ = the lower bandpass limit. The microprocessor system 14 includes a peripheral interface adapter 20 which receives the inputs from waveform shaping circuit 10 and converter 12 and is input-output coupled to microprocessor 22. Microprocessor 22 further receives inputs from a read only memory (ROM) 24 which provides program storage. The microprocessor is also input-output coupled to a RAM (random access memory) 26 for data storage and to a peripheral interface adaptor (PIA) 28 for providing output to buffer 16 and converter 18. Control input swiches 30 provide a scan option and allow selection of optional bandpass function, such as search, scan, and increment.

Control input switch 30 comprises an array of switches that provides a digital input to the periphral interface adapter 20 thereby changing the data coupled to microprocessor 22, which changes $f_L$ and $f_H$ reference comparison parameters. This allows the bandwidth to be changed thereby accomplishing search, scan, or increment functions. In its simplest state, switch array 30 may be simple mechanical switches.

Waveform shaper 10 and converter 12 prepare the continuous input signal for digital processing. PIA 20 formats the inputs for the microprocessor. The microprocessor is under program control stored in ROM 24. Variable data and microprocessor "scratch pad" memory are combined in RAM 26. The microprocessor outputs both the stored amplitude information and bandpass detection signal to the output PIA 28. PIA 28 formats this digital information for the converter 18. Buffer 16 provides buffered circuitry for the output bandpass detection. If amplitude information is not desired converters 12 and 18 can be omitted.

In operation of the system, entering a program is accomplished by executing the stored program in ROM. Initially the interface devices 20 and 28 are preconditioned, as is well established in the art, to accept data inputs and format output information. A memory location Ml in RAM 26 is cleared to serve as a counter. The input threshold signal, whose width represents the period of the continuous input signal, is sensed. When this signal goes to a logical one, indicating that the threshold has been crossed, the microprocessor begins counting. The count continues until the input signal returns to a logical zero. The count contained in memory location Ml represents the period duration of the continuous input signal. The count of Ml is compared with two constants held in ROM representing the higher band edge $f_H$, and the lower band edge, $f_L$. The center frequency $f_o$, is calculated as $(f_H + f_L)/2$.

Figure 3:
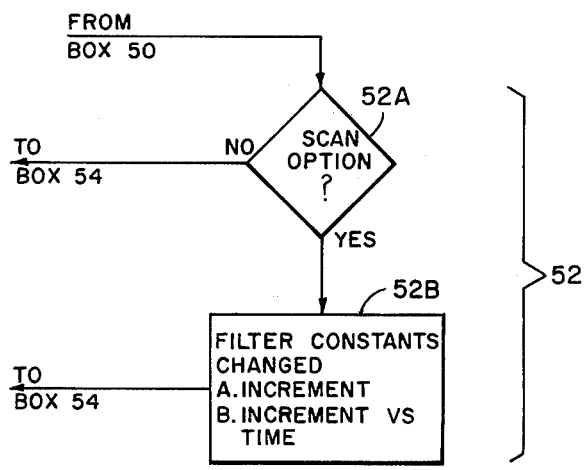
FIGS. 2 and 3 are flow charts illustrating the basic detection process for the circuit of FIG. 1.
Figure 2:
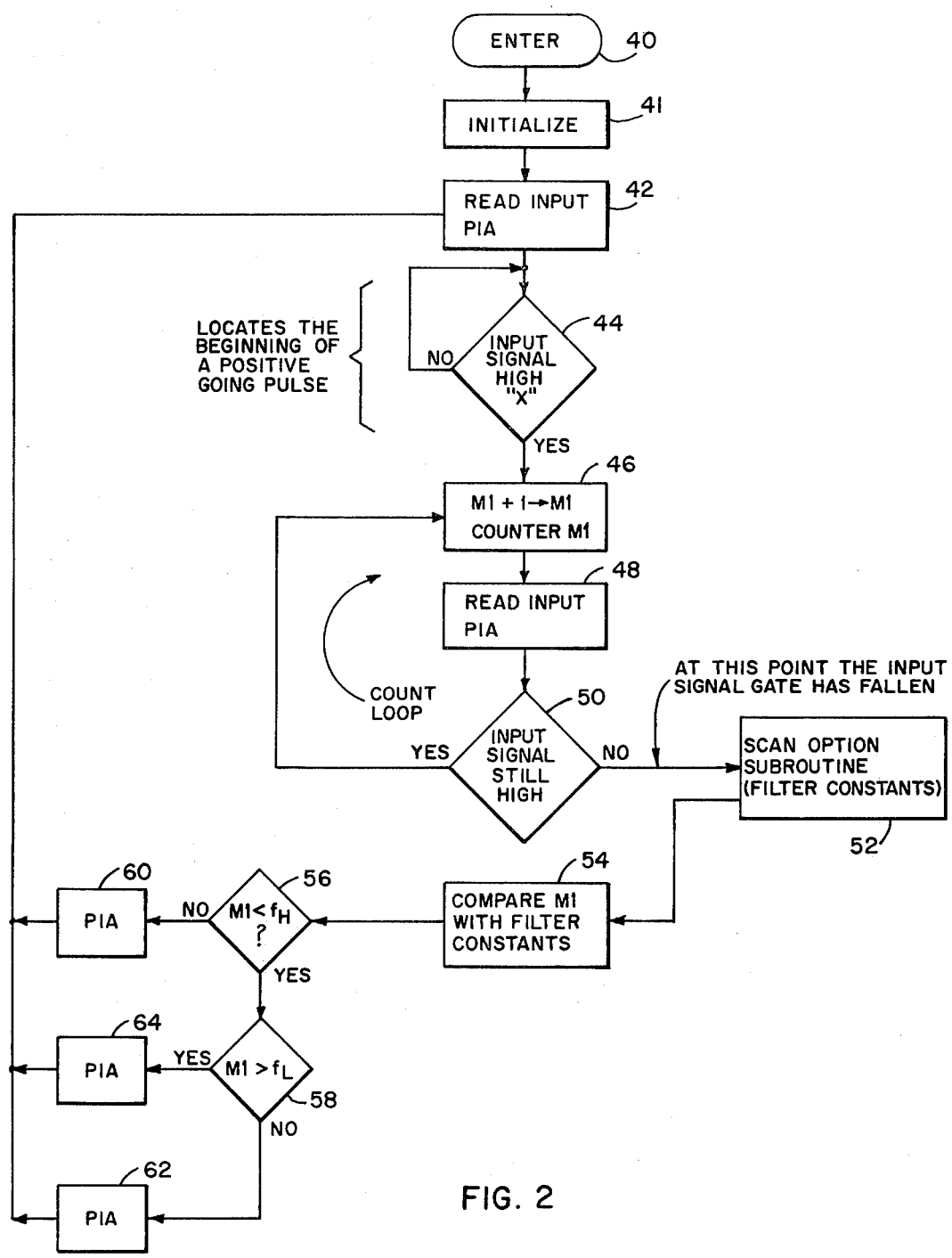

The flow chart shown in FIGS. 2 and 3 disclose the basic detection process. Box 40 indicates entering of the program and box 41 of the program performs any necessary housekeeping steps such as zeroing data locations and specifying key values. The memory location M1 of RAM 26 is cleared to serve as a counter. This occurs in response to control switch 30 inputs being operated. In box 42 the continuous input signals to shaping circuit 10 and converter 12 are read. Box 44 indicates the status of these signals. When the input signal width exceeds the threshold, a logical 1 indicates the input signal is high and the control program advances to box 46. Otherwise a logical 0 indicates a low input signal and the system continues to look for the beginning of a positive going pulse that exceeds threshold. With a logical 1, the RAM memory M1 starts counting as shown in box 46. In box 48 the input to PIA 20 is read between or during counts performed in box 46. In box 50 the input signal status, high or low, is determined. If the input signal remains high the count is continued in M1. Thus, boxes 46, 48, and 50 form a count loop which continues the count until the input signal returns to a logical zero. When a logical zero occurs, the input signal gate has fallen and the count terminates. Memory M1 now contains the count indicative of the continuous input signal duration.

At this point the scan option subroutine of box 52 may be checked and the subroutine shown in FIG. 3 boxes 52A and 52B accomplished. In box 52A the scan option is considered. If no option has been selected by the control switches 30, the next step, box 54, is the comparison of the data in M1 with the filter constants held in ROM 24. The filter constant $f_L$ and $f_H$ are compared with M1 data to determine if the M1 count is within the bandpass of the filter. Boxes 56 and 58 are decision steps. If the M1 count is greater than $f_H$ the input signal is higher than the bandpass established in ROM 24 and the output PIA 28 is loaded with data determined in box 60. If the M1 count is less than $f_H$ the input signal is less than the bandpass upper limit and the decision box 58 then determines whether or not the M1 count is greater or less than $f_L$. If the count is less than $f_L$ the signal is lower than bandpass and the output PIA 28 is loaded with data determined in box 62. If the count is more than $f_L$, the signal lies within the bandpass and the output PIA is loaded with the data in box 64. In addition the amplitude information of the input signal, which has been stored, is now output from microprocessor 22 via peripheral interface adapter 28 to converter 18 if the signal was within the pass band.

The constants $f_L$ and $f_H$ can be modified during each process cycle during a scan option or they can remain fixed to provide a predetermined digital detector. This option is selected in box 52. As shown in FIG. 3, if the constants are allowed to remain fixed, no scan occurs and the process path is from box 50 to box 2A to box 54.

Thus the microprocessor samples the converter 12 output during the period of the input waveform and during the period the threshold of shaping circuit 10 is exceeded to determine the period of the input waveform. The amplitude information is stored during this period. The RAM 26 provides a total count during this period, providing detection of energy within the pass band. High and low bandpass signals are then available as well as the center frequency at buffer 16. When a passband detection is made, the amplitude information of the stored input signal is processed and sent to digital-to-analog converter 18 for output. The output of buffer 16 and converter 18 may then be used to provide the desired output signal data and in addition these signals may be used to terminate the processing or may be used to initialize a subsequent cycle.

If the filter constants are modified as in box 52B, scanning is performed under softwave control. This scanning process is accomplished during the decoding portion of the softwave program as the threshold decision value is updated. Typically, this can be done by operator control or by using the preprogrammed subroutine of box 52B.

For every two filter constants ($f_L$ and $f_H$) the lower and upper bandpass edges are determined. Controlling these constants, controls the bandpass and center frequency. Scanning is a method of adjusting the filter constants in several ways. Scanning allows control of any individual filter setting simply by changing softwave constants. This is preset as an incremental change ($\pm \Delta$) for $f_L$ and $f_H$. Therefore, $f_L$ and $f_H$ both may be incremented toward $f_o$ to reduce the bandpass or may both be incremented away from $f_o$ to increase the bandpass. Similarly, $f_L$ and $f_H$ may both be incremented in the same direction to move the bandpass to either side of its original or starting position and thereby seek the incoming signal. Thus, for example, when the boxes 56 and 60 indicate that the input signal is higher than the bandpass programmed in the detector, the scan option subroutine 52 can change the filter constants by some $\Delta$ value so that the upper limit $f_H$ approaches the input signal frequency. Once the input signal frequency falls within the bandpass (m1 < $f_H$) the signal would be processed as noted hereinabove. Additionally, the passband could be narrowed while keeping the signal within the passband if desired.

Thus scanning allows change of $f_L$ and $f_H$ as a function of time under processor control. Typically, in data aquisition a scanning cycle may be performed and an error signal generated that is proportional to the distance away from a predetermined value of the filter, usually the center frequency. This error signal can be used to control the positioning of the input signal.

A microprocessor controlled digital detector of filter system may be operated using estalished off the shelf hardware, for example, as follows:

| | |
|---|---|
| waveform shaping 10 (Schmitt trigger) | 7413, Raytheon |
| analog-to-digital converter 12 | 5121, Micro Net |
| buffer 16 | 7437, Raytheon |
| digital-to-aloalog converter 18 | R-2R Ladder network |
| PIA 20, 28 | 6821, Motorola |
| Microprocessor 22 | 6800, Motorola |
| RAM 26 | 6810, Motorola |
| ROM 24 | 6830, Motorola |

Typically, the Motorola 6800 series components are adapted for interface and operation with other Motorola 6800 components. Their interconnection and operation are well established as evidenced in detail in "The Complete Motorola Microcomputer Data Library" published in 1978 by Motorola Semiconductor Products Inc.

The microprocessor system allows both the center frequency and the bandpass to vary while preserving signal amplitude. With the Motorola 6800 Microprocessor and 20 samples per period, the maximum frequency signal that can be processed is 3 Khz.

The inventors, D. K. Fronek and R. A. Lane, presented a paper entitled "A Microprocessor Controlled Digital Filter" at the International Society for Mini and Microcomputers conference held in Los Angeles, California, Jan. 17, 1979. This paper addresses the invention concept but does not disclose specific hardware for accomplishing the function.

While the invention has been described in connection with a specific embodiment thereof, it will be understood that other modifications will support themselves to those skilled in the art and that it is intended to cover such modifications that fall within the scope of the claims appended hereto.

We claim:

1. A microprocessor controlled digital detector for detecting the presence of selected frequencies in an input signal comprising: a microprocessor system having a plurality of inputs and outputs, a waveform shaping circuit having an input adapted to receive an input frequency signal and an output coupled to said microprocessor system, an analog-to-digital converter having an input coupled to receive said input frequency signal and an output coupled to said microprocessor system, a buffer coupled to receive an output from said microprocessor system and having an output indicative of the bandpass of said input signal, and a digital-to-analog converter having an input coupled to an output of said microprocessor system and having an output indicative of the amplitude of said input signal.

2. A microprocessor controlled digital detector as set forth in claim 1 wherein said microprocessor system comprises a microprocessor, a first interface means coupled between said microprocesser, said shaping circuit, and said analog-to-digital converter for directing input signals to said microprocessor; and a second interface means coupled between said microprocessor, said buffer and said digital-to-analog converter for directing output signals from said microprocessor.

3. A microprocessor controlled digital detector as set forth in claim 2 wherein said microprocessor system further comprises a read only memory coupled to said microprocessor for programmably providing read only storage from memory to said microprocessor; and a random access memory coupled to said microprocessor for providing input signal data storage for said microprocessor.

4. A microprocessor controlled digital detector as set forth in claim 3 wherein said first and second interface means are respective peripheral interface adapters.

5. In a microprocessor controlled digital detector for detecting the presence of a selectable frequency above a threshold value of amplitude, the method of detection comprising the steps of:
   establishing preliminary, adjustable upper and lower band edge limits for a bandpass within a digital memory circuit;
   detecting a continuous wave frequency input signal;
   counting digital pulses indicative of the positive half cycle of said continuous wave frequency for obtaining a pulse count equivalent to the period of said frequency;
   comparing the count of said digital pulses to said established band edge limits for determining whether the count lies below, within, or above said limits;
   providing an output signal indicative of the upper and lower limits of said band edge; and
   adjusting said limits incrementally and recomparing the pulse count to the band edge limits until said pulse count falls within said adjustable upper and lower limits.

6. The method of detecting the presence of a selectable frequency as set forth in claim 5 and comprising the further steps of:
   adjusting said limits incrementally in the direction of said pulse count and recomparing the pulse count to the band edge limits until said pulse count falls within said upper and lower limits; and
   providing an output signal indicative of the center frequency between said upper and lower band edge limits when said count falls between said limits.

* * * * *